United States Patent
Tanaka et al.

(10) Patent No.: US 10,976,392 B2
(45) Date of Patent: Apr. 13, 2021

(54) GRADIENT COIL

(71) Applicant: CANON MEDICAL SYSTEMS CORPORATION, Otawara (JP)

(72) Inventors: Hidekazu Tanaka, Nasushiobara (JP); Takuma Kawai, Nasushiobara (JP); Yoshitomo Sakakura, Nasushiobara (JP); Motohisa Yokoi, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 16/277,068

(22) Filed: Feb. 15, 2019

(65) Prior Publication Data

US 2019/0257901 A1 Aug. 22, 2019

(30) Foreign Application Priority Data

Feb. 19, 2018 (JP) .............................. JP2018-026899

(51) Int. Cl.
*G01R 33/385* (2006.01)
*H01F 6/06* (2006.01)
*G01R 33/421* (2006.01)

(52) U.S. Cl.
CPC ....... *G01R 33/385* (2013.01); *G01R 33/3858* (2013.01); *G01R 33/4215* (2013.01); *H01F 6/06* (2013.01)

(58) Field of Classification Search
CPC .............. G01R 33/385; G01R 33/3858; G01R 33/4215

USPC .......................................................... 324/318
See application file for complete search history.

(56) References Cited

U.S. PATENT DOCUMENTS

| | | | | |
|---|---|---|---|---|
| 6,144,204 A | * | 11/2000 | Sementchenko | G01R 33/385 324/318 |
| 7,554,326 B2 | * | 6/2009 | Sakakura | G01R 33/288 324/307 |
| 2001/0033168 A1 | | 10/2001 | Heid | |
| 2004/0189298 A1 | * | 9/2004 | Vavrek | G01R 33/385 324/309 |
| 2007/0063705 A1 | * | 3/2007 | Ham | G01R 33/385 324/318 |
| 2008/0259560 A1 | * | 10/2008 | Lvovsky | G01R 33/3856 361/689 |
| 2010/0085053 A1 | * | 4/2010 | Iwasa | G01R 33/3804 324/318 |
| 2010/0271028 A1 | * | 10/2010 | Kawamoto | G01R 33/3873 324/318 |
| 2011/0074421 A1 | * | 3/2011 | Sakakura | G01R 33/3856 324/318 |

(Continued)

FOREIGN PATENT DOCUMENTS

JP 2001-353136 12/2001

*Primary Examiner* — Steven L Yeninas
(74) *Attorney, Agent, or Firm* — Oblon, McClelland, Maier & Neustadt, L.L.P.

(57) ABSTRACT

A gradient coil according to an embodiment is configured to generate gradient magnetic fields along a plurality of axes in an imaging space in which a subject is imaged. The gradient coil includes a coil corresponding to at least one of the plurality of axes, wherein an electrically-conductive member of the coil is formed so as to be partitioned in a thickness direction by a plurality of electrically-insulative layers.

8 Claims, 6 Drawing Sheets

(56) References Cited

U.S. PATENT DOCUMENTS

| | | | | |
|---|---|---|---|---|
| 2012/0068707 A1* | 3/2012 | Begg | .......................... | H02P 3/06 |
| | | | | 324/318 |
| 2012/0068708 A1* | 3/2012 | Camp | .................. | G01R 33/341 |
| | | | | 324/318 |
| 2012/0235685 A1* | 9/2012 | Abe | ....................... | G01R 33/20 |
| | | | | 324/322 |
| 2014/0139219 A1* | 5/2014 | Camp | ................. | G01R 33/3858 |
| | | | | 324/318 |
| 2014/0167762 A1* | 6/2014 | Sugiyama | .......... | G01R 33/3858 |
| | | | | 324/322 |
| 2014/0184372 A1* | 7/2014 | Mathieu | ............. | G01R 33/3858 |
| | | | | 336/60 |
| 2015/0177347 A1* | 6/2015 | Tsujita | ............... | G01R 33/3856 |
| | | | | 324/322 |
| 2016/0109542 A1* | 4/2016 | Sakakura | ............ | G01R 33/385 |
| | | | | 324/322 |
| 2017/0038444 A1* | 2/2017 | Seeber | ............... | G01R 33/3858 |
| 2017/0219668 A1* | 8/2017 | Thiagarajan | ....... | G01R 33/3858 |
| 2018/0024211 A1* | 1/2018 | Bindseil | ............ | G01R 33/3802 |
| | | | | 324/322 |
| 2018/0156880 A1* | 6/2018 | Lin | .................... | G01R 33/3856 |
| 2018/0313914 A1* | 11/2018 | Camp | ............. | G01R 33/34007 |
| 2020/0049779 A1* | 2/2020 | Overweg | ............... | G01R 33/56 |

\* cited by examiner

FIG.10

GRADIENT COIL

CROSS-REFERENCE TO RELATED APPLICATIONS

This application is based upon and claims the benefit of priority from Japanese Patent Application No. 2018-026899, filed on Feb. 19, 2018, the entire contents of which are incorporated herein by reference.

FIELD

Embodiments described herein relate generally to a gradient coil.

BACKGROUND

Conventionally, a gradient coil included in a Magnetic Resonance Imaging (MRI) apparatus may have an alternating current at approximately hundreds Hz to 1 kHz flow therein during imaging processes. Generally speaking, when such an alternating current in a radio frequency range flows therein, regions of the gradient coil where the electric current is flowing are unevenly positioned in the vicinity of the surface of coil patterns due to a skin effect. It is known that, as a result, the resistance of the gradient coil increases.

DETAILED DESCRIPTION

A gradient coil according to an embodiment is configured to generate gradient magnetic fields along a plurality of axes in an imaging space in which a subject is imaged. The gradient coil includes a coil corresponding to at least one of the plurality of axes, wherein an electrically-conductive member of the coil is formed so as to be partitioned in a thickness direction by a plurality of electrically-insulative layers.

Exemplary embodiment of a gradient coil explained in detail below, with reference to the accompanying drawings.

First Embodiment

Figure 1:
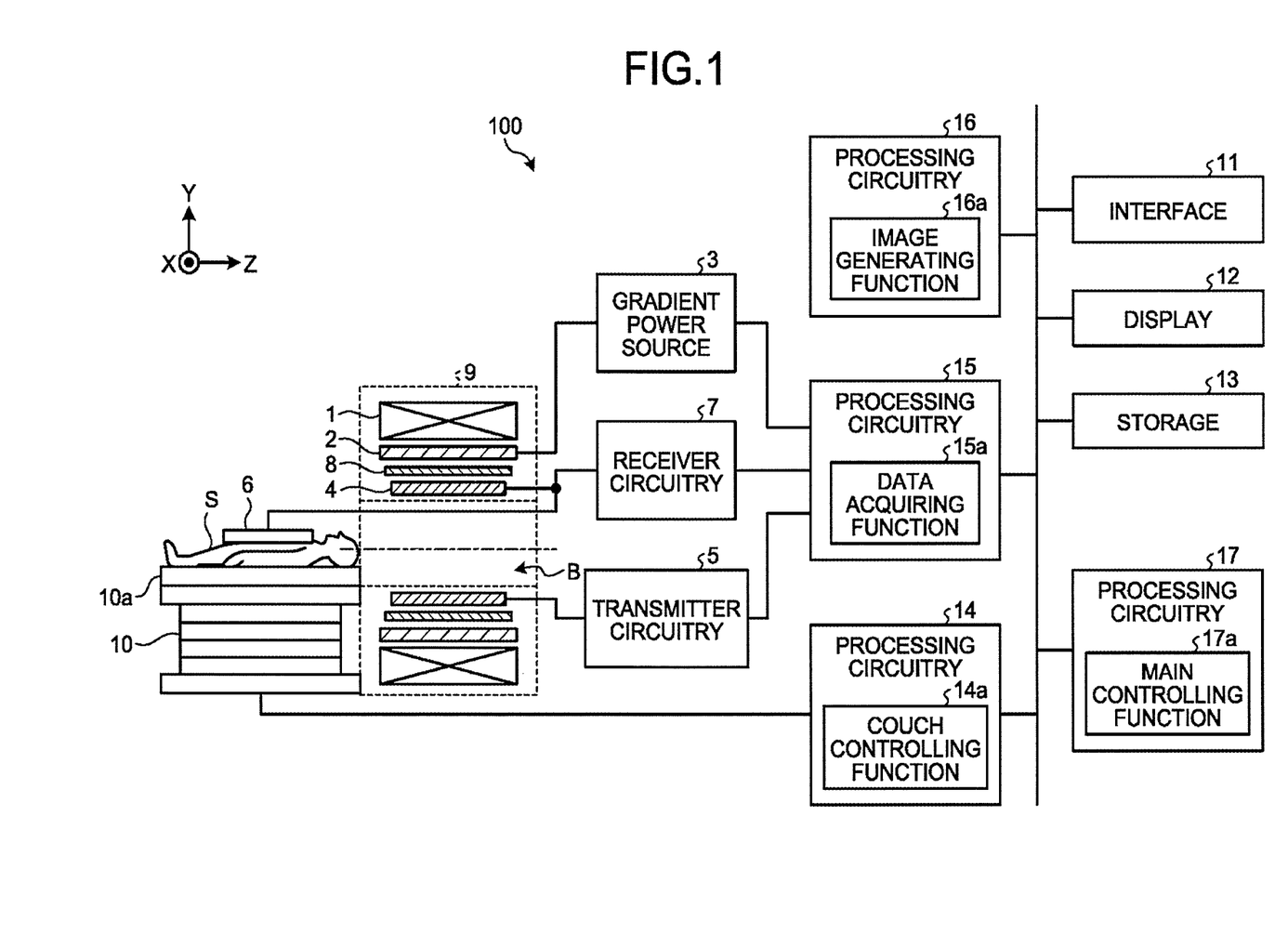
FIG. 1 is a diagram illustrating an exemplary configuration of an MRI apparatus according to a first embodiment.

FIG. 1 is a diagram illustrating an exemplary configuration of an MRI apparatus according to a first embodiment.

For example, as illustrated in FIG. 1, an MRI apparatus 100 according to the present embodiment includes a magnet 1, a gradient 2, a gradient power source 3, a whole body (WB) coil 4, transmitter circuitry 5, a local coil 6, receiver circuitry 7, an Radio Frequency (RF) shield 8, a gantry 9, a couch 10, an interface 11, a display 12, a storage 13, and processing circuitries 14 to 17.

The magnet 1 is configured to generate a static magnetic field in an imaging space in which a subject S is imaged. More specifically, the magnet 1 is formed to have a hollow and substantially circular cylindrical shape (which may have an oval cross-section orthogonal to the central axis thereof) and is configured to generate the static magnetic field in the imaging space positioned inside the circular cylinder. For example, the magnet 1 includes a cooling container formed to have a substantially circular cylindrical shape and a magnet such as a superconductive magnet that is immersed in a cooling member (e.g., liquid helium) filling the cooling container. In this situation, for example, the magnet 1 may be configured to generate the static magnetic field by using a permanent magnet.

The gradient coil 2 is arranged on the inside of the magnet 1 and is configured to generate gradient magnetic fields along a plurality of axial directions, within the imaging space in which the subject S is imaged. More specifically, the gradient coil 2 is formed to have a hollow and substantially circular cylindrical shape (which may have an oval cross-section orthogonal to the central axis thereof) and is configured to generate the gradient magnetic fields along the axial directions of X-, Y-, and Z-axes that are orthogonal to one another, within the imaging space positioned inside the circular cylinder. In this situation, the X-axis, the Y-axis, and the Z-axis structure an apparatus coordinate system unique to the MRI apparatus 100. For example, the 2-axis coincides with the axis of the circular cylinder of the gradient coil 2 and is set so as to extend along a magnetic flux of the static magnetic field generated by the magnet 1. Further, the X-axis is set so as to extend in a horizontal direction orthogonal to the Z-axis. The Y-axis is set so as to extend in a vertical direction orthogonal to the Z-axis. A configuration of the gradient coil 2 will be explained in detail later.

By supplying an electric current to the gradient coil 2, the gradient power source 3 is configured to cause the gradient magnetic fields to be generated along the axial directions of the X-, Y-, and Z-axes, within the space provided on the inside of the gradient coil 2. The path of the electric current used for generating the gradient magnetic field extending along the X-axis direction may be referred to as an X-channel. The path of the electric current used for generating the gradient magnetic field extending along the Y-axis direction may be referred to as a Y-channel. The path of the electric current used for generating the gradient magnetic field extending along the Z-axis may be referred to as a Z-channel.

As explained above, as a result of the gradient power source 3 generating the gradient magnetic fields extending along the axial directions of the X-, Y-, and Z-axes, the gradient magnetic fields are generated along a readout direction, a phase-encoding direction, and a slice direction, respectively. The axes extending along the readout direction, the phase-encoding direction, and the slice direction structure a logical coordinate system used for defining slice regions or a volume region serving as a target of an imaging process. In the following sections, the gradient magnetic field generated along the readout direction will be referred to as a readout gradient magnetic field. The gradient magnetic field generated along the phase-encoding direction will be referred to as a phase-encoding gradient magnetic field. The gradient magnetic field generated along the slice direction will be referred to as a slice gradient magnetic field.

Further, the gradient magnetic fields are superimposed on the static magnetic field generated by the magnet 1 and append spatial position information to Magnetic Resonance (MR) signals emitted from the subject S. More specifically, the readout gradient magnetic field appends position information along the readout direction to an MR signal, by varying the frequency of the MR signal in accordance with the position in the readout direction. Further, the phase-encoding gradient magnetic field appends position information in the phase-encoding direction to an MR signal, by varying the phase of the MR signal along the phase-encoding direction. Further, the slice gradient magnetic field appends position information along the slice direction to an MR signal. For example, when an imaging region is represented by slice regions, the slice gradient magnetic field is used for determining the orientations, the thicknesses, and the quantity of the slice regions. In contrast, when an imaging region is represented by a volume region, the slice gradient magnetic field is used for varying the phase of the MR signal in accordance with the position in the slice direction.

The WB coil 4 is a Radio Frequency (RF) coil arranged on the inside of the gradient coil 2 and configured to have a function of a transmitter coil that applies a Radio Frequency (RF) magnetic field to the imaging space in which the subject S is imaged and a function of a receiver coil that receives the MR signals emitted from the subject S due to an influence of the RF magnetic field. More specifically, the WB coil 4 is formed to have a hollow and substantially circular cylindrical shape (which may have an oval cross-section orthogonal to the central axis thereof) and is configured to apply the RF magnetic field to the imaging space positioned inside the circular cylinder, on the basis of an RF pulse signal supplied thereto from the transmitter circuitry 5. Further, the WB coil 4 is configured to receive the MR signals emitted from the subject S due to the influence of the RF magnetic field and to output the received MR signals to the receiver circuitry 7.

The transmitter circuitry 5 is configured to output an RF wave signal corresponding to a Larmor frequency to the WB coil 4. More specifically, the transmitter circuitry 5 includes an oscillator, a phase selector, a frequency converter, an amplitude modulator, and an RF amplifier. The oscillator is configured to generate an RF wave (radio frequency) signal having a resonant frequency (the Larmor frequency) unique to a target atomic nucleus placed in the static magnetic field. The phase selector is configured to select a phase of the RF wave signal. The frequency converter is configured to convert the frequency of the RF wave signal output from the phase selector. The amplitude modulator is configured to generate an RF pulse signal, by modulating the amplitude of the RF wave signal output from the frequency converter, with the waveform of a sinc function, for example. The RF amplifier is configured to power-amplify the RF pulse signal output from the amplitude modulator and to output the result to the WB coil 4.

The local coil 6 is an RF coil having a function of a receiver coil configured to receive the MR signals emitted from the subject S. More specifically, the local coil 6 is attached to the subject S placed on the inside of the ¶B coil 4 and is configured to receive the MR signals emitted from the subject S due to the influence of the RF magnetic field applied by the WB coil 4 and to output the received MR signals to the receiver circuitry 7. For example, the local coil 6 is a receiver coil prepared for any of various sites subject to an imaging process and may be a receiver coil for the head, a receiver coil for the neck, a receiver coil for a shoulder, a receiver coil for the chest, a receiver coil for the abdomen, a receiver coil for a leg, a receiver coil for the spine, or the like. In this situation, the local coil 6 may further have a function of a transmitter coil configured to apply an RF magnetic field to the subject S. In that situation, the local coil 6 is connected to the transmitter circuitry 5 and is configured to apply the RF magnetic field to the subject S on the basis of an RF pulse signal supplied thereto from the transmitter circuitry 5.

The receiver circuitry 7 is configured to generate MR signal data on the basis of the MR signals output from either the WB coil 4 or the local coil 6 and to output the generated MR signal data to the processing circuitry 15. For example, the receiver circuitry 7 includes a selector, a pre-amplifier, a phase detector, and an Analog/Digital (A/D) converter. The selector is configured to selectively receive an input of the MR signals output from either the NB coil 4 or the local coil 6. The pre-amplifier is configured to power-amplify the MR signals output from the selector. The phase detector is configured to detect the phase of the MR signals output from the pre-amplifier. The A/D converter is configured to generate the MR signal data by converting an analog signal output from the phase detector into a digital signal, and to output the generated MR signal data to the processing circuitry 15.

The RF shield 8 is disposed between the gradient coil and the NB coil 4 and is configured to shield the gradient coil 2 from the RF magnetic field generated by the NB coil 4. More specifically, the RF shield 8 is formed to have a hollow and substantially circular cylindrical shape (which may have an oval cross-section orthogonal to the central axis thereof) and is disposed in the space formed on the inner circumferential side of the gradient coil 2 so as to cover the outer circumferential surface of the WB coil 4.

The gantry 9 houses therein the magnet 1, the gradient coil 2, the WB coil 4, and the RF shield 8. More specifically, the gantry 9 has a bore B that is hollow and formed to have a circular cylindrical shape. While the magnet 1, the gradient coil 2, the WB, coil 4, and the RF shield 8 are arranged so as to surround the bore B, the gantry 9 houses these elements therein. In this situation, the space formed on the inside of the bore B of the gantry 9 serves as the imaging space in which the subject S is placed when an imaging process is performed on the subject S.

In the present example, the configuration is explained in which the MRI apparatus 100 has a so-called tunnel-like structure where the magnet 1, the gradient coil 2, and the WB coil 4 are each formed to have a substantially circular cylindrical shape; however, possible embodiments are not limited to this example. For instance, the MRI apparatus 100 may have a so-called open structure where a pair of magnets, a pair of gradient coils, and a pair of RF coils are each arranged so as to face each other while the imaging space in which the subject S is placed is interposed therebetween.

The couch 10 includes a couchtop 10a on which the subject S is placed. When an imaging process is performed on the subject 3, the couchtop 10a is inserted to the inside of the bore B of the gantry 9. For example, the couch 10 is installed in such a manner that the longitudinal direction thereof extends parallel to the central axis of the magnet 1.

The interface 11 is configured to receive operations to input various types of instructions and various types of information from an operator. More specifically, the interface 11 is connected to the processing circuitry 17 and is configured to convert the input operations received from the operator into electrical signals and to output the electrical signals to the processing circuitry 17. For example, the interface 11 may be realized by using a trackball, a switch button, a mouse, a keyboard, a touch-pad on which an input operation can be performed by touching the operation surface thereof, a touch-screen in which a display screen and a touch-pad are integrally formed, a contactless input circuit using an optical sensor, an audio input circuit, and/or the like that are used for setting an imaging condition, a Region of Interest (ROI), and the like. In the present disclosure, the interface 11 does not necessarily have to include one or more physical operational component parts such as a mouse, a keyboard, and/or the like. Examples of the interface 11 include, for instance, an electrical signal processing circuit configured to receive an electrical signal corresponding to an input operation from an external input device provided separately from the apparatus and to output the electrical signal to a controlling circuit.

The display 12 is configured to display various types of information and various types of images. More specifically, the display 12 is connected to the processing circuitry 17 and is configured to convert data of the various types of information and the various types of images sent thereto from the processing circuitry 17 into display-purpose electrical signals and to output the electrical signals. For example, the display 12 may be realized by using a liquid crystal monitor, a Cathode Ray Tube (CRT) monitor, a touch-panel, or the like.

The storage 13 is configured to store therein various types of data. More specifically, the storage 13 is configured to store the MR signal data and image data therein. For example, the storage 13 may be realized by using a semiconductor memory element such as a Random Access Memory (RAM), a flash memory, or the like, a hard disk, an optical disk, or the like.

The processing circuitry 14 includes a couch controlling function 14a. The couch controlling function 14a is connected to the couch 10 and is configured to control operations of the couch 10 by outputting a control-purpose electrical signal to the couch 10. For example, via the interface 11, the couch controlling function 14a is configured to receive an instruction to move the couchtop 10a in a longitudinal direction, an up-and-down direction, or a left-and-right direction from the operator and to operate a moving mechanism for the couchtop 10a included in the couch 10 so as to move the couchtop 10a according to the received instruction.

The processing circuitry 15 includes a data acquiring function 15a. The data acquiring function 15a is configured to acquire the MR signal data of the subject S by driving the gradient power source 3, the transmitter circuitry 5, and the receiver circuitry 7.

More specifically, the data acquiring function 15a acquires the MR signal data by executing various types of pulse sequences on the basis of sequence execution data output from the processing circuitry 17. In this situation, the sequence execution data is information defining a pulse sequence indicating a procedure for acquiring the MR signal data. More specifically, the sequence execution data is information that defines: the timing with which the electric current is to be supplied from the gradient power source 3 to the gradient coil 2 and the intensity of the electric current to be supplied; the intensity of the RI pulse signal to be supplied from the transmitter circuitry 5 to the WB coil 4 and the timing with which the RF pulse signal is to be supplied; the detection timing with which the MR signals are to be detected by the receiver circuitry 7, and the like.

Further, as a result of executing any of various types of pulse sequences, the data acquiring function 15a receives the MR signal data from the receiver circuitry 7 and stores the received MR signal data into the storage 13. In this situation, a set made up of pieces of MR signal data received by the data acquiring function 15a is stored in the storage 13 as data structuring a k-space as a result of being arranged two-dimensionally or three-dimensionally according to the position information appended thereto by the readout gradient magnetic field, the phase-encoding gradient magnetic field, and the slice gradient magnetic field explained above.

The processing circuitry 16 includes an image generating function 16a. The image generating function 16a is configured to generate an image on the basis of the MR signal data stored in the storage 13. More specifically, the image generating function 16a generates the image by reading the MR signal data stored in the storage 13 by the data acquiring function 15a and further performing a post-processing process, i.e., a reconstructing process (a Fourier transform or the like) on the read MR signal data. Further, the image generating function 16a stores image data of the generated image into the storage 13.

The processing circuitry 17 includes a main controlling function 17a. By controlling constituent elements of the MRI apparatus 100, the main controlling function 17a is configured to exercise overall control of the MRI apparatus 100. For example, the main controlling function 17a receives an input of an imaging condition from the operator via the interface 11. Further, the main controlling function 17a executes various types of pulse sequences by generating sequence execution data on the basis of the received imaging condition and transmitting the generated sequence execution data to the processing circuitry 15. Further, for example, the main controlling function 17a reads image data from the storage 13 in response to a request from the operator and outputs the read image data to the display 12.

For example, it is possible to realize each of the processing circuitries 14 to 17 described above by using a processor. In that situation, for example, the processing function of each of the processing circuitries 14 to 17 is stored in the storage 13 in the form of a computer-executable program. Further, the processing circuitries realize the functions corresponding to the programs by reading and executing the programs from the storage 13. In other word each of the processing circuitries that has read the corresponding program has the function illustrated in the processing circuitry in FIG. 1. In this situation, the example is explained in which the plurality of processors realize the processing functions; however, another arrangement is also acceptable in which the processing circuitries are structured by using a single processor so that the processor realizes the functions by executing the programs. Further, the processing functions of the processing circuitries may be realized as being distributed to a plurality of processing circuitries or as being integrated together into a single processing circuitry, as appropriate. Further, in the above description, the example is explained in which the single storage (i.e., the storage 13) is configured to store therein the programs corresponding to the processing functions; however, another arrangement is also acceptable in which a plurality of storages are provided in a distributed manner, so that the processing circuitries each read a corresponding one of the programs from a corresponding one of the individual storages.

Figure 2:
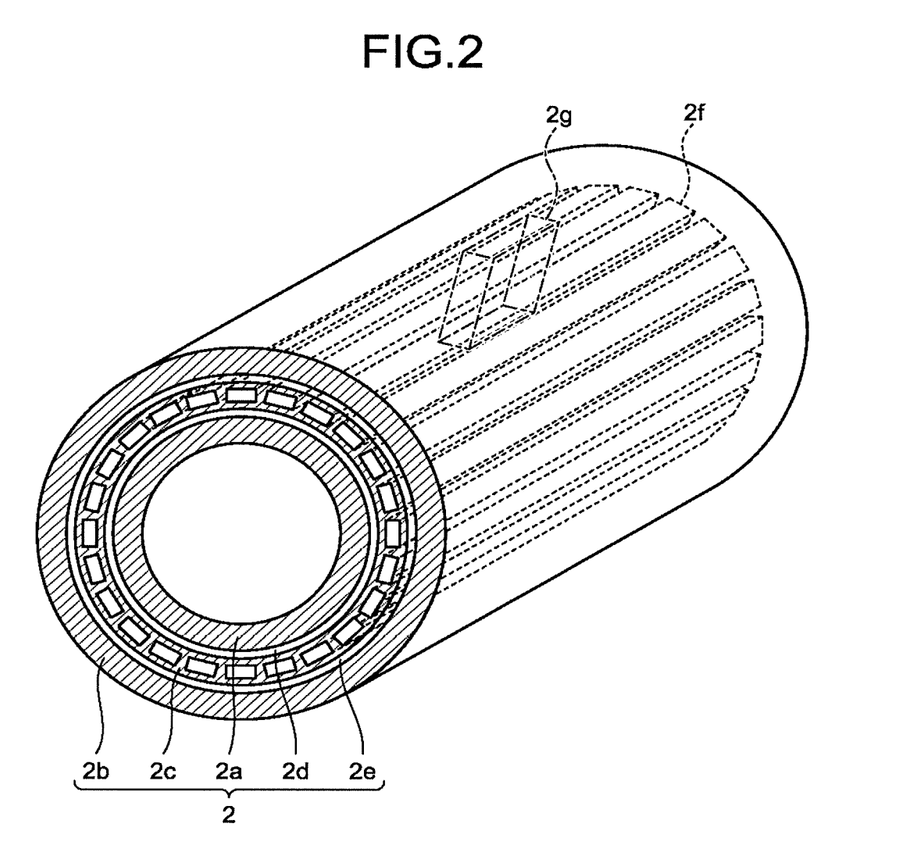
FIG. 2 is a perspective view illustrating a configuration of a gradient coil according to the first embodiment.

FIG. 2 is a perspective view illustrating a configuration of the gradient coil according to the first embodiment.

In the present embodiment, an example will be explained in which the gradient coil 2 is an Actively Shielded Gradient Coil (ASGC). For example, as illustrated in FIG. 2, the gradient coil 2 includes: a main coil 2a configured to generate a gradient magnetic field; a shield coil 2b configured to generate a shielding-purpose magnetic field that cancels out a leakage magnetic field; a shim layer 2c in which shim trays are arranged; and a first cooling layer and a second cooling layer 2e in which cooling pipes are arranged.

In this situation, in the gradient coil 2 according to the present embodiment, the main coil 2a, the first cooling layer 2d, the shim layer 2c, the second cooling layer 2e, and the shield coil 2b are laminated in the stated order, in the direction radially away from the central axis of the substantially circular cylindrical structure of the gradient coil 2.

In the shim layer 2c, a plurality of shim tray insertion guides 2f in each of which a shim tray can be arranged are formed. For example, each of the shim tray insertion guides 2f is a hole penetrating the gradient coil 2 for the whole length thereof in the long-axis direction thereof. The shim tray insertion guides 2f are provided at regular intervals along the circumferential direction. In this situation, each of the shim trays (omitted from FIG. 2) to be inserted in a corresponding one of the shim tray insertion guides 2f has a plurality of pockets that are arranged along the longitudinal direction of the shim tray. Further, one or more iron shims of which the quantity is adjusted as appropriate are housed in each of the pockets for the purpose of correcting non-uniformity of the static magnetic field.

In each of the first cooling layer 2d and the second cooling layer 2e, a cooling pipe (omitted from FIG. 2) used for cooling the gradient coil 2 is disposed. For example, each of the cooling pipes is arranged in a helical formation along the substantially circular cylindrical shape of the gradient coil 2. Further, each of the cooling pipes is configured to circulate refrigerant within the gradient coil 2 by causing the refrigerant to flow through the pipe, the refrigerant being supplied from a cooling device having a heat exchanger and a circulation pump.

The main coil 2a has coil patterns each corresponding to a different one of the axial directions of the X-axis, the Y-axis, and the Z-axis. For example, the main coil 2a is formed by laminating three coil patterns corresponding to the axial directions of the X-axis, the Y-axis, and the Z-axis, respectively, that are orthogonal to one another. In the following sections, the coil pattern corresponding to the X-axis direction will be referred to as an X-coil, while the coil pattern corresponding to the Y-axis direction will be referred to as a Y-coil, and the coil pattern corresponding to the Z-axis direction will be referred to as a Z-coil.

Figure 3:
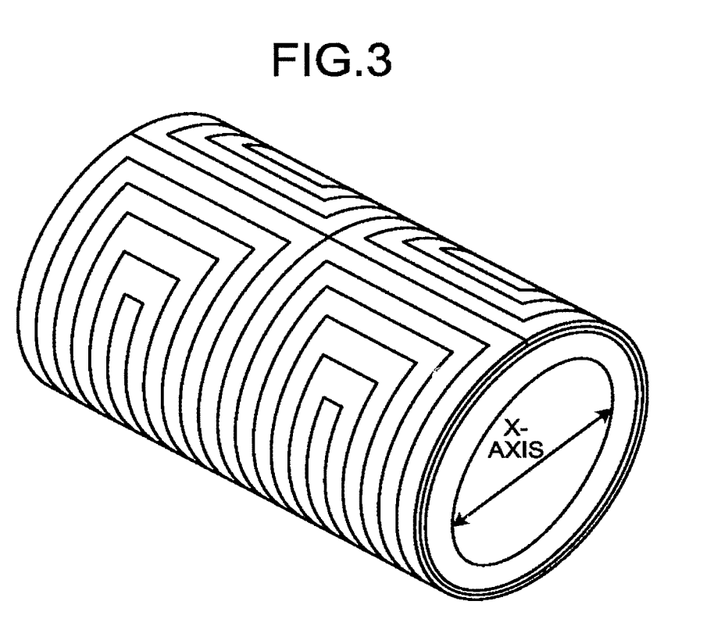
FIG. 3 is a perspective view of an X-coil according to the first embodiment.
Figure 4:
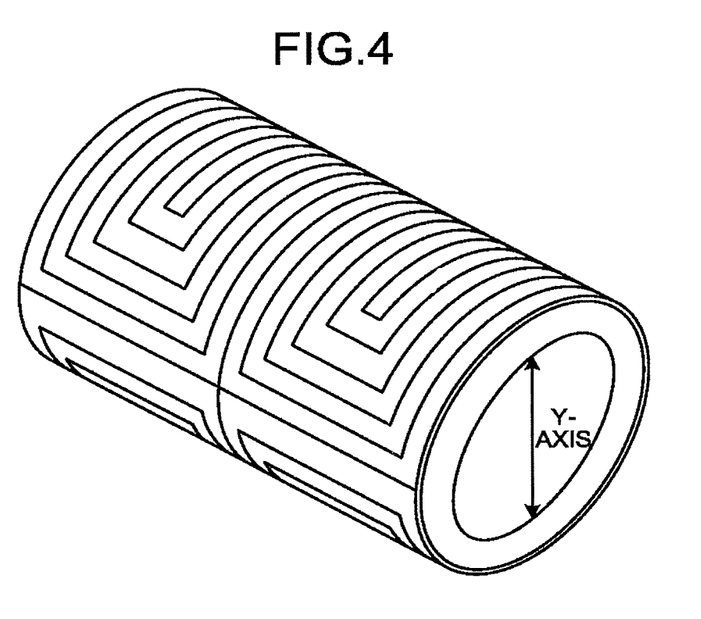
FIG. 4 is a perspective view of a Y-coil according to the first embodiment.
Figure 5:
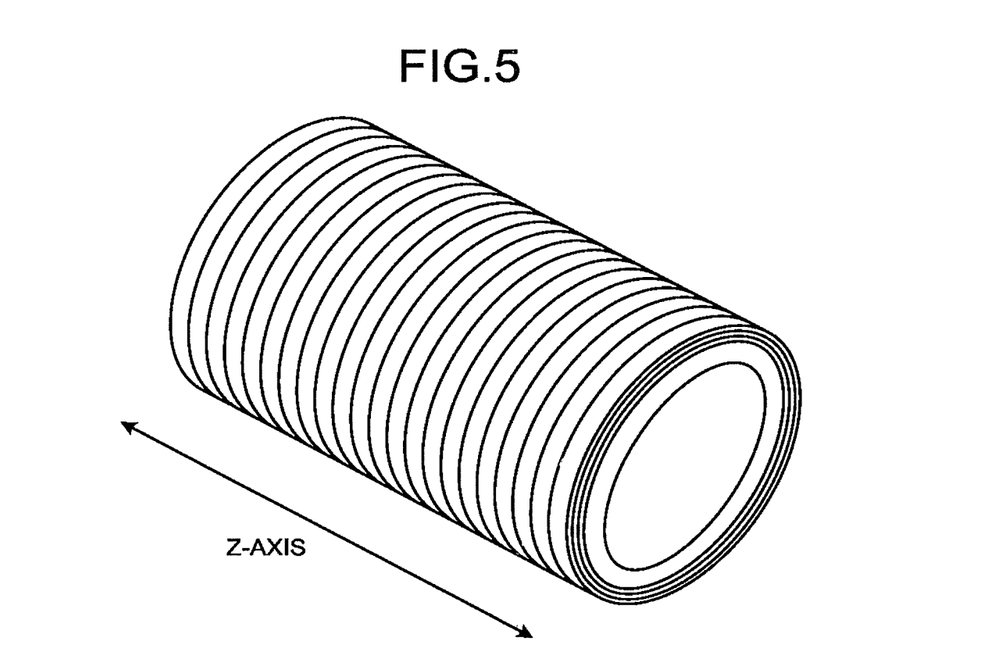
FIG. 5 is a perspective view of a Z-coil according to the first embodiment.

FIG. 3 is a perspective view illustrating the X-coil according to the first embodiment. FIG. 4 is a perspective view illustrating the Y-coil according to the first embodiment. FIG. 5 is a perspective view illustrating the Z-coil according to the first embodiment.

For example, as illustrated in FIG. 3, the X-coil is formed to have a saddle-like shape and is configured to generate a gradient magnetic field along the X-axis, i.e., a horizontal axis of the substantially circular cylinder of the gradient coil 2. Further, for example, as illustrated in FIG. 4, similarly to the X-coil, the Y-coil is formed to have a saddle-like shape, but is configured to generate a gradient magnetic field along the Y-axis, i.e., a vertical axis of the substantially circular cylinder of the gradient coil 2. Further, for example, as illustrated in FIG. 5, the Z-coil is formed to have a helical shape and is configured to generate a gradient magnetic field along the Z-axis, i.e., the long axis of the substantially circular cylinder of the gradient coil 2. The K-coil, the Y-coil, and the Z-coil are each configured to individually receive the supply of the electric current from the gradient power source 3 and to generate the gradient magnetic field of which the magnetic field intensity varies along the corresponding one of the axial directions of the X-axis, the Y-axis, and the Z-axis.

Although detailed explanations thereof will be omitted, similarly to the main coil 2a, the shield coil 2b is also formed by laminating three coils, namely, an X-coil, a Y-coil, and a Z-coil corresponding to the X-axis, the Y-axis, and the Z-axis, respectively, that are orthogonal to one another.

Figure 6:
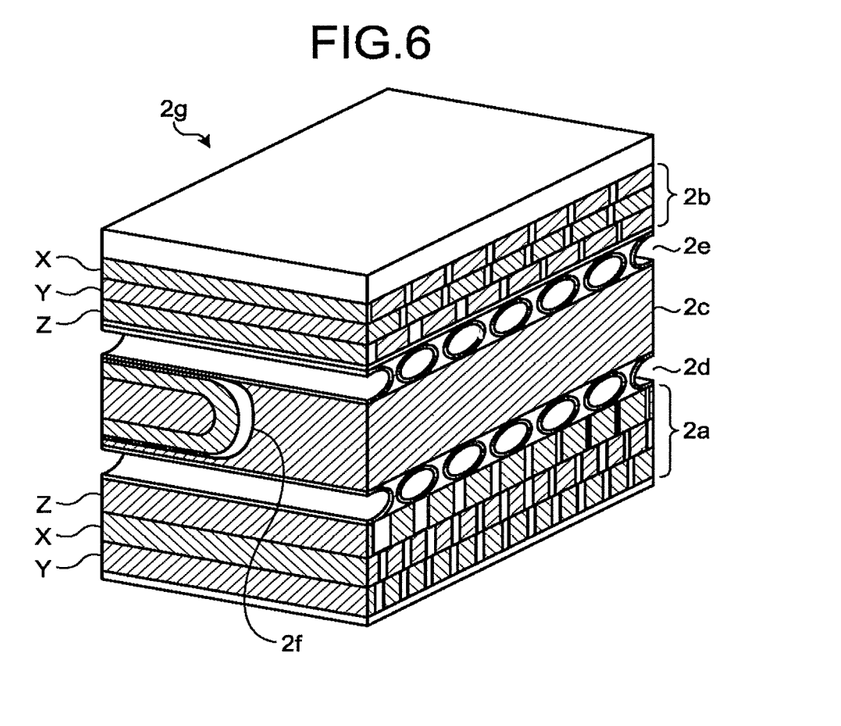
FIG. 6 is a drawing illustrating a manner in which layers are laminated in the gradient coil according to the first embodiment.

FIG. 6 is a drawing illustrating a manner in which the layers are laminated in the gradient coil 2 according to the first embodiment.

FIG. 6 illustrates a section 2g of the gradient coil 2 indicated with a dashed line in FIG. 2. In the present example, the up-and-down direction in FIG. 6 corresponds to the radial direction of the gradient coil 2. The top side in FIG. 6 corresponds to the outer circumferential side of the gradient coil 2. The bottom side in FIG. 6 corresponds to the inner circumferential side of the gradient coil 2.

For example, as illustrated in FIG. 6, the main coil 2a and the shield coil 2b each include the X-coil (X), the Y-coil (Y), and the (Z).

In this situation, for example, in the main coil 2a, the coil patterns are laminated in the order of the Y-coil, the X-coil, and the Z-coil, from the inner circumferential side toward the outer circumferential side of the gradient coil 2. In contrast, for example, in the shield coil 2b, the coil patterns are laminated in the order of the Z-coil, the Y-coil, and the X-coil from the inner circumferential side toward the outer circumferential side of the gradient coil 2. In other words, in the present example, with respect to the coil patterns in the main coil 2a and in the shield coil 2b, the Z-coils included therein are each positioned closest to the cooling layers (the first cooling layer 2d and the second cooling layer 2e). Further, the Y-coil included in the main coil 2a and the X-coil included in the shield coil 2b are each positioned farthest from the cooling layers.

Possible examples of the order in which the coil patterns can be laminated in the main coil 2a and in the shield coil 2b of the gradient coil 2 are not limited to the example illustrated in FIG. 6. It is possible to modify the order as appropriate, in accordance with requirements from designs of the gradient coil 2.

An overall configuration of the MRI apparatus 100 according to the present embodiment has thus been explained. In the MRI apparatus 100 according to the present embodiment configured as described above, an alternating current at approximately hundreds Hz to 1 kHz may flow through the gradient coil 2, when an imaging process is performed on the subject S.

Generally speaking, when such an alternating current in a radio frequency range flows, regions of the gradient coil where the electric current is flowing are unevenly positioned in the vicinity of the surface of the coil patterns due to a skin effect. It is known that, as a result, the resistance of the gradient coil increases.

Figure 7:
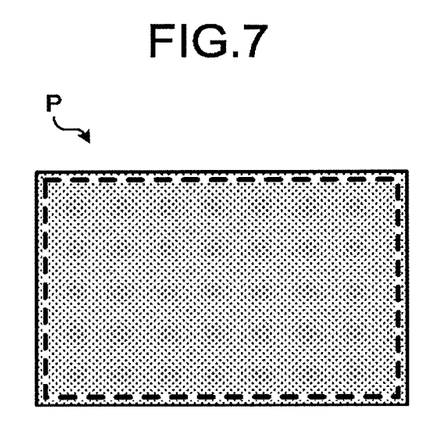
FIG. 7 is a drawing illustrating a coil pattern of a gradient coil according to a comparison example of the present embodiment.

FIG. 7 is a drawing illustrating a coil pattern of a gradient coil according to a comparison example of the present embodiment.

With respect to a coil pattern P, which is one of the plurality of coil patterns of the gradient coil, for example, FIG. 7 illustrates a cross-sectional plane taken along the radial direction and the circumferential direction of the gradient coil. In this situation, the up-and-down direction in FIG. 7 corresponds to the radial direction of the gradient coil. The left-and-right direction in FIG. 7 corresponds to the circumferential direction of the gradient coil. The radial direction of the gradient coil coincides with the thickness direction of the coil pattern P, whereas the circumferential direction of the gradient coil coincides with the width direction of the coil pattern P.

For example, as illustrated in FIG. 7, when an alternating current in a radio frequency range flows through the gradient coil, the regions where the electric current flows (indicated with the broken line in FIG. are unevenly positioned in the vicinity of the surface of the coil pattern P. As a result, the resistance of the gradient coil increases.

When the resistance of the gradient coil increases in this manner due to the skin effect, the amount of heat generated by the gradient coil increases. As a result, there is a possibility that the quality of the coil itself may be degraded or that the imaging condition may be limited due to temperature restrictions. Further, the increase in the resistance of the gradient coil will lead to an insufficient power level of the gradient power source. As a result, it may become necessary in some situations to limit the imaging condition.

In this situation, for example, as a method for inhibiting the increase in the resistance caused by the skin effect, one possible idea is to form the coil patterns of the gradient coil by using a litz wire in which a plurality of thin copper wires are twisted together, instead of a copper wire. When a litz wire is used, because there are a plurality of separated cross-sections of the copper wires, the electric current flows on the borders of the cross-sections of the copper wires, even when the skin effect is present. It is therefore possible to inhibit the increase in the resistance caused by the skin effect. However, generally speaking, litz wires are expensive, and it is also difficult to process litz wires into saddle-like shapes such as those of the coli patterns illustrated in FIGS. 3 and 4.

For this reason, the MRI apparatus 100 according to the present embodiment is configured to keep large the region where the electric current flows in the gradient coil 2 even when the skin effect is present, by increasing the surface area of each of the coil patterns, without using litz wires. With this arrangement, it is possible to inhibit the increase in the resistance caused by the skin effect in the gradient coil 2.

In this regard, in the present embodiment, all the coil patterns (the X-coils, the Y-coils, and the Z-coils) contained in the main coil 2a and in the shield coil 2b included in the gradient coil 2 are structured in the manner described below.

More specifically, the coil patterns included in the gradient coil 2 are formed in such a manner that, in at least a part thereof, first layers that are electrically-conductive and second layers that are electrically-insulative repeatedly appear in the thickness direction.

Figure 8:
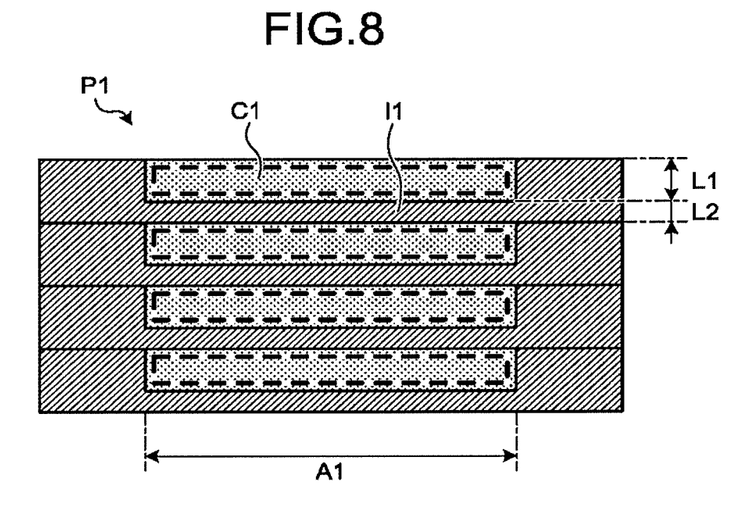
FIG. 8 is a drawing illustrating an example of a coil pattern of the gradient coil according to the first embodiment.

FIG. 8 is a drawing illustrating an example of a coil pattern of the gradient coil 2 according to the first embodiment.

With respect to a coil pattern P1, which is one of the plurality of coil patterns included in the gradient coil 2, FIG. 8 illustrates, for example, a cross-sectional plane taken along the radial direction and the circumferential direction of the gradient coil 2. In this situation, the up-and-down direction in FIG. 8 corresponds to the radial direction of the gradient coil 2. The left-and-right direction in FIG. 8 corresponds to the circumferential direction of the gradient coil 2. Further, the radial direction of the gradient coil 2 coincides with the thickness direction of the coil pattern P1. The circumferential direction of the gradient coil coincides with the width direction of the coil pattern P1.

For example, as illustrated in FIG. 8, in the coil pattern P1 according to the present embodiment, first layers L1 and second layers L2 are alternately laminated in the thickness direction, in a part A1 in the width direction of the coil pattern P1. In this situation, the first layers L1 are each formed with an electrically-conductive member C1. The second layers L2 are each formed with an electrically-insulative member I1.

For example, the coil pattern P1 is manufactured by alternately laminating a thin copper wire forming the first layers L1 and electrically-insulative resin forming the second layers L2, through an etching process or the like. Alternatively, for example, the coil pattern P1 may be manufactured by using a three-dimensional (3D) printer.

Further, the plurality of first layers L1 included in the coil pattern P1 are electrically connected to one another so that, as a whole, gradient magnetic fields extending in mutually the same axial direction are generated. For example, the first layers L1 are connected to one another either directly or indirectly via lead wires or the like, in the end parts of the gradient coil 2 in terms of the axial direction.

In other words, in the present embodiment, the coil pattern P1 includes, as the first layers L1, a first electrically-conductive member and a second electrically-conductive member that is laminated over the first electrically-conductive member while the electrically-insulative layer (a second layer L2) is interposed therebetween, so that the first electrically-conductive member and the second electrically-conductive member generate the gradient magnetic fields in mutually the same axial direction.

As explained above, in the first embodiment, as a result of laminating the first layers L1 that are electrically-conductive and the second layers L2 that are electrically-insulative in the thickness direction in at least a part of the coil pattern P1, it is possible to structurally separate the electrically-conductive parts where the electric current flows, in the thickness direction. As a result, it is possible to increase the surface area of the coil pattern P1 with the surfaces of the separated parts. Accordingly, even when the skin effect is present, the regions where the electric current flows (indicated with the broken line in FIG. 8) are larger than the current-flowing region in a coil pattern in which the electrically-conductive part is not separated, as illustrated in FIG. 7.

Consequently, according to the first embodiment, it is possible to inhibit the increase in the resistance caused by the skin effect in the gradient coil 2. Further, it is also possible to inhibit the increase in the amount of heat generated by the gradient coil 2 to be caused by the increase in the resistance in the gradient coil 2. Further, compared to the example in which the coil patterns are formed by using litz wires, it is possible realize the gradient coil 2 having higher manufacturabillty that can be manufactured at a lower cost.

In the first embodiment described above, the quantities of the first layers L1 and the second layers L2 do not necessarily have to be those illustrated in FIG. 8. The larger the quantity of the first layers L1 is, the larger will be the surface area of the coil pattern, as a consequence. It is therefore possible to enhance the effect of inhibiting the increase in the resistance. For this reason, it is desirable to arrange the quantity of the first layers L1 to be as large as possible, for example, within a restriction range compliant with the manufacturing cost, the manufacturing method, and the like.

As explained above, in the first embodiment, the gradient coil 2 is configured to generate the gradient magnetic fields along the plurality of axes in the imaging space in which the subject is imaged. The gradient coil 2 includes the coil corresponding to at least one of the plurality of axes, wherein the electrically-conductive member of the coil is formed so as to be partitioned in the thickness direction by the plurality of electrically-insulative layers.

Further, in the first embodiment, in the gradient coil 2, the first layers forming the electrically-conductive member of the coil and the second layers serving as the electrically-insulative layers are alternately laminated in the thickness direction.

Further, in the first embodiment, the gradient coil 2 includes the coil corresponding to at least one of the plurality of axes, wherein the coil includes the first electrically-conductive member and the second electrically-conductive member laminated over the first electrically-conductive member while the electrically-insulative layer is interposed therebetween, and the first electrically-conductive member and the second electrically-conductive member are configured to generate gradient magnetic fields in mutually the same axial direction.

Second Embodiment

Further, in the first embodiment above, the example is explained in which the first layers L1 formed with the electrically-conductive member and the second layers L2 formed with the electrically-insulative member are alternately laminated in the thickness direction, in at least a part of each of the coil patterns included in the gradient coil 2. However, possible embodiments are not limited to this example. For instance, the second layers may be formed by gaps provided between the plurality of first layers. In the following sections, this example will be explained as a second embodiment. The second embodiment will be explained while a focus is placed on differences from the embodiment described above. Some of the constituent elements that have the same functions as those of the constituent elements explained above will be referred to by using the same reference characters, and detailed explanations thereof will be omitted.

In the present embodiment, all the coil patterns (the X-coils, the Y-coils, and the Z-coils) contained in the main coil 2a and in the shield coil 2b included in the gradient coil 2 are structured in the manner described below.

More specifically, the coil patterns included in the gradient coil 2 are formed in such a manner that, in at least a part thereof, a plurality of first layers are arranged so as to have gaps therebetween in the thickness direction, while the second layers are formed by those gaps.

Figure 9:
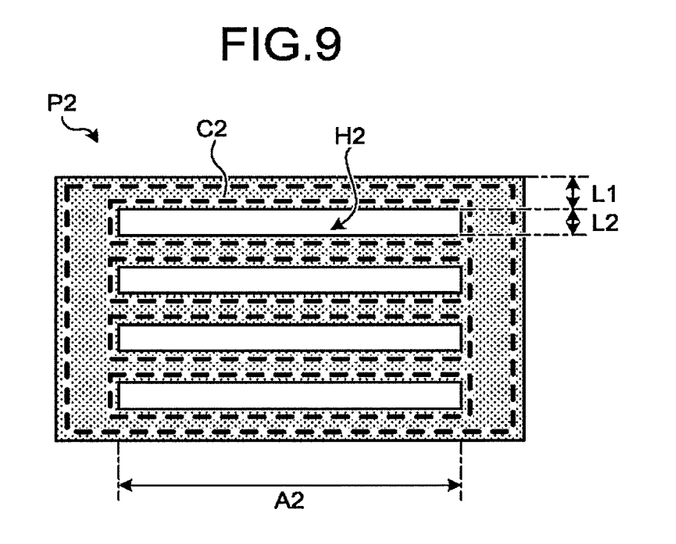
FIG. 9 is a drawing illustrating an example of a coil pattern of a gradient coil according to a second embodiment.

FIG. 9 is a drawing illustrating an example of a coil pattern of the gradient coil 2 according to the second embodiment.

With respect to a coil pattern P2, which is one of the plurality of coil patterns included in the gradient coil 2, FIG. 9 illustrates, for example, a cross-sectional plane taken along the radial direction and the circumferential direction of the gradient coil 2. In this situation, the up-and-down direction in FIG. corresponds to the radial direction of the gradient coil 2. The left-and-right direction in FIG. 9 corresponds to the circumferential direction of the gradient coil 2. Further, the radial direction of the gradient coil 2 coincides with the thickness direction of the coil pattern P2. The circumferential direction of the gradient coil 2 coincides with the width direction of the coil pattern P2.

For example, as illustrated in FIG. 9, in the coil pattern P2 according to the present embodiment, a plurality of first layers L1 are arranged so as to have gaps therebetween in the thickness direction, while second layers L2 are formed by the gaps, in a part A2 in the width direction of the coil pattern P2. In this situation, the first layers L1 are each formed with an electrically-conductive member C2.

Further, in the present embodiment, the coil pattern P2 is formed in such a manner that the gaps between the first layers L1 are hollow spaces H2, by joining together the end parts, in terms of the width direction, of the plurality of first layers L1. In this situation, the part used for joining the first layers L1 together is formed by using the electrically-conductive member C2, similarly to the first layers L1. With this arrangement, the plurality of hollow spaces H2 are formed on the inside of the coil pattern 22, so that the hollow spaces H2 partially electrically insulate the first layers L1 from one another.

For example, the coil pattern P2 may be manufactured as an integrally-formed product by using a 3D printer or the like. With this arrangement, the plurality of first layers L1 included in the coil pattern P2, as a whole, generate gradient magnetic fields in mutually the sa axial direction.

Further, the hollow spaces H2 do not each necessarily have to be shaped to have a rectangular cross-section. For example, the hollow spaces H2 may each have a circular cross-section. Further, the hollow spaces H2 may be formed in two or more parts, in terms of the width direction, of the coil pattern P2. In that situation, between each pair made up of the first layers L1, two or more hollow spaces H2 are formed while being arranged next to one another in the width direction of the coil pattern P2.

As explained above, in the second embodiment, the plurality of hollow spaces H2 are formed on the inside of the coil pattern P2, in at least a part of the coil pattern P2. Accordingly, the electrically-conductive parts where the electric current flows are arranged in a non-contiguous manner in the thickness direction. As a result, it is possible to increase the surface area of the coil pattern P2 with the surfaces of the non-contiguous parts. Accordingly, even when the skin effect is present, the regions where the electric current flows (indicated with the broken line in FIG. 9) are larger than the current-flowing region in a coil pattern in which the electrically-conductive part is contiguous, as illustrated in FIG. 7.

Consequently, according to the second embodiment also, it is possible to inhibit the increase in the resistance caused by the skin effect in the gradient coil 2. Further, it is also possible to inhibit the increase in the amount of heat generated by the gradient coil to be caused by the increase in the resistance in the gradient coil 2. Further, compared to the example in which the coil patterns are formed by using litz wires, it is possible to realize the gradient coil 2 having higher manufacturability that can be manufactured at a lower cost.

Further, in the second embodiment above, another arrangement is also acceptable in which, for example, the hollow spaces H2 formed on the inside of the coil pattern P2 are used as cooling pipes for cooling the gradient coil 2. In that situation, for example, the hollow spaces H2 are each formed to have a tube-like shape extending through the inside of the coil pattern P2. By causing refrigerant supplied from a cooling device to flow through the hollow spaces H2, the coil pattern P2 is configured to circulate the refrigerant within the gradient oil 2. In that situation, for example, it is also acceptable to omit the first cooling layer 2d and the second cooling layer 2e from the gradient coil 2.

Further, in the second embodiment described above, the quantities of the first layers L1 and the second layers L2 do not necessarily have to be those illustrated in FIG. 9. Similarly to the first embodiment, the larger the quantity of the first layers L1 is, the larger will be the surface area of the coil pattern, as a consequence. It is therefore possible to enhance the effect of inhibiting the increase in the resistance. For this reason, in the second embodiment also, it is desirable to arrange the quantity of the first layers L1 to be as large as possible, for example, within a restriction range compliant with the manufacturing cost, the manufacturing method, and the like.

As explained above, according to the second embodiment, in the gradient coil 2, the layers forming the electrically-conductive member of each of the coils are, in at least a part thereof, structured with the plurality of layers arranged so as to have the gaps therebetween in the thickness direction, so that the electrically-insulative layers are formed by the gaps.

Further, according to the second embodiment, in the gradient coil 2, the gaps are formed as the hollow spaces by joining together the end parts of the plurality of layers.

Furthermore, according to the second embodiment, in the gradient coil 2, the hollow spaces are each formed to have the tube-like shape extending through the inside of each of the coils, and the coils are each configured to arrange the refrigerant to flow through the hollow spaces.

Third Embodiment

In the first and the second embodiments described above, the example is explained in which each of the coil patterns included in the gradient coil 2 is formed in such a manner that, in at least a part thereof, the first layers that are electrically-conductive and the second layers that are electrically-insulative repeatedly appear in the thickness direction. However, possible embodiments are not limited to this example. For instance, each of the coil patterns may be formed to have a hollow space having projecting areas and recessed areas formed on the surface thereof. In the following sections, this example will be explained as a third embodiment. The third embodiment will be explained while a focus is placed on differences from the embodiment described above. Some of the constituent elements that have the same functions as those of the constituent elements explained above will be referred to by using the same reference characters, and detailed explanations thereof will be omitted.

In the present embodiment, all the coil patterns (the X-coils, the Y-coils, and the Z-coils) contained in the main coil 2a and in the shield coil 2b included in the gradient coil 2 are structured in the manner described below.

Figure 10:
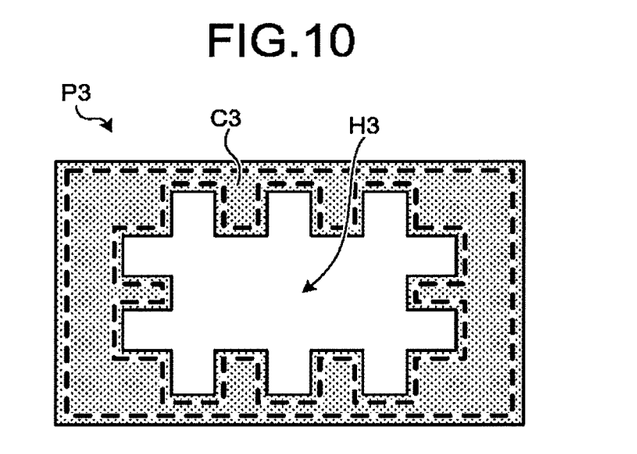
FIG. 10 is a drawing illustrating an example of a coil pattern of a gradient coil according to a third embodiment.

FIG. 10 is a drawing illustrating an example of a coil pattern of the gradient coil 2 according to the third embodiment.

With respect to a coil pattern P3, which is one of the plurality of coil patterns included in the gradient coil 2, FIG. 10 illustrates, for example, a cross-sectional plane taken along the radial direction and the circumferential direction of the gradient coil 2. In this situation, the up-and-down direction in FIG. 10 corresponds to the radial direction of the gradient coil 2. The left-and-right direction in FIG. 10 corresponds to the circumferential direction of the gradient coil 2. Further, the radial direction of the gradient coil 2 coincides with the thickness direction of the coil pattern P3.

The circumferential direction of the gradient coil 2 coincides with the width direction of the coil pattern P3.

For example, as illustrated in FIG. 10, the coil pattern P3 according to the present embodiment has a hollow space H3 formed on the inside thereof, and projecting and recessed areas are provided on the surface of the hollow space H3. In this situation, the part of the coil pattern 33 other than the hollow space H3 is formed by using an electrically-conductive member C3.

For example, the coil pattern P3 is manufactured as an integrally-formed product by using a 3D printer. With this arrangement, the coil pattern P3, as a whole, generates gradient magnetic fields in mutually the same axial direction.

As for the projecting and recessed areas provided on the surface of the hollow space H3, the projections and the recesses do not each necessarily have to have a rectangular cross-section. For example, the projections and the recesses may each have an arc-shaped cross-section. Further, the projecting and recessed areas provided for the hollow space H3 do not necessarily have to be provided on the entire surface of the hollow space H3. It is sufficient when the projecting and recessed areas are provided on at least a part of the entire surface.

As explained above, in the third embodiment, the hollow space H3 having the projecting and recessing areas provided on the surface thereof is formed on the inside of the coil pattern P3. Accordingly, it is therefore possible to arrange the circumferential length of the hollow space to be longer than that in the example where a hollow space having a simple shape (e.g., having a rectangular or circular cross-section) is formed on the inside of the coil pattern. As a result, it is possible to increase the surface area of the coil pattern P3 with the surfaces of the hollow space. Accordingly, even when the skin effect is present, the regions where the electric current flows (indicated with the broken line in FIG. 10) are larger than the current-flowing region in a coil pattern having no hollow space as illustrated in FIG. 7 or the current-flowing region in a coil pattern in which a hollow space having a simple shape (e.g., having a rectangular or circular cross-section) is formed on the inside thereof.

Consequently, according to the third embodiment also, it is possible to inhibit the increase in the resistance caused by the skin effect in the gradient coil 2. Further, it is also possible to inhibit the increase in the amount of heat generated by the gradient coil 2 to be caused by the increase in the resistance in the gradient coil 2. Further, compared to the example in which the coil patterns are formed by using litz wires, it is possible to realize the gradient coil 2 having higher manufacturability that can be manufactured at a lower cost.

In the third embodiment described above also, another arrangement is acceptable in which, for example, the hollow space H3 formed on the inside of the coil pattern P3 is used as a cooling pipe for cooling the gradient coil 2. In that situation, for example, the hollow space H3 is formed to have a tube-like shape extending through the inside of the coil pattern P3. By causing refrigerant supplied from a cooling device to flow through the hollow space H3, the coil pattern P3 is configured to circulate the refrigerant within the gradient coil 2. In that situation, for example, it is also acceptable to omit the first cooling layer 2d and the second cooling layer 2e from the gradient coil 2.

As explained above, in the third embodiment, the gradient coil 2 is configured to generate the gradient magnetic fields along the plurality of axes in the imaging space in which the subject is imaged. The gradient coil 2 includes the coil provided for each of axes, wherein each of the coils has the hollow space formed on the inside thereof, and the projecting and recessed areas are provided on the surface of the hollow space.

Further, in the third embodiment, in the gradient coil 2, the hollow space is formed to have the tube-like shape extending through the inside of the coil, and each of the coils is configured to arrange the refrigerant to flow through the hollow space.

The first to the third embodiments have thus been explained. Further, it is also possible to carry out any of the embodiments while a part thereof is modified as appropriate.

For instance, in the embodiments described above, the examples are explained in which all the coil patterns contained in the main coil 2a and in the shield coil included in the gradient coil 2 are formed in the manner described in each of the embodiments; however, possible embodiments are not limited to those examples.

For instance, it is also acceptable to arrange only one or more of the coil patterns included in the main coil 2a and in the shield coil 2b of the gradient coil 2 to be formed in the manner described in any of the embodiments. In that situation, for example, among the X-coil, the Y-coil, and the Z-coil, the two coil patterns other than either the coil pattern positioned farthest from the cooling layers (the first cooling layer 2d and the second cooling layer or the coil pattern positioned closest to the cooling layers are formed in the manner described in any of the embodiments.

For instance, in the example illustrated in FIG. 6, one or both of the Y coil included in the main coil 2a and the X-coil included in the shield coil 2b or the X- and Y-coils included in each of the main coil 2a and the shield coil 2b are formed in the manner described in any of the embodiments. In that situation, for example, the remaining coil patterns may be formed in the manner illustrated in FIG. 7 or may be structured by using litz wires.

Further, for example, the X-coil, the Y-coil, and the Z-coil may be formed in manners described in mutually-different embodiments.

For instance, in the example illustrated in FIG. 6, in the main coil 2a and the shield coil 2b, the respective Z-coils may be formed in the manners described in the second and the third embodiments, so that arranging the refrigerant to flow through the hollow spaces serves as an alternative to the cooling layers, while the K-coils and the Y-coils are formed in the manner described in the first embodiment.

Further, in the embodiments described above, the example is explained in which the gradient coil 2 is an ASGC including the main coil 2a and the shield coil 2b; however, possible embodiments are not limited to this example. For instance, the gradient coil 2 may be a Non-Shielded Gradient Coil (NSGC) including no shield coil. In that situation, the coil patterns contained in the main coil included in the NSGC are formed in the manner described in any of the embodiments above.

The term "processor" used in the above explanations denotes, for example, a Central Processing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). In this situation, instead of saving the programs in the storage, it is also acceptable to directly incorporate the programs in the circuits of the processors. In that situation, each of the processors realizes the functions thereof by reading and executing the corresponding one of the programs incorporated in the circuit thereof. Further, the processors in the present embodiments do not each necessarily have to be structured as a single circuit. It is also acceptable to structure one processor by combining together a plurality of independent circuits so as to realize the functions thereof. Further, it is also acceptable to integrate two or more of the constituent elements illustrated in FIG. 1 into one processor so as to realize the functions thereof.

In this situation, for example, the programs executed by the one or more processors are provided as being incorporated, in advance, in a Read-Only Memory (ROM), a storage, or the like. Alternatively, the programs may be provided as being recorded on a computer-readable storage medium such as a Compact Disk Read-Only Memory (CD-ROM), a Flexible Disk (FD), a Compact Disk Recordable (CD-R), a Digital Versatile Disk (DVD), or the like, in a file in such a format that is either installable or executable for the devices. Further, the programs may be stored in a computer connected to a network such as the Internet, so as to be provided or distributed as being downloaded via the network. For example, each of the programs is structured with a module including the functional units described above. In the actual hardware, as a result of a CPU reading and executing the programs from a storage medium such as a ROM, the modules are loaded into a main storage device so as to be generated in the main storage device.

According to at least one aspect of the embodiments described above, it is possible to inhibit the increase in the resistance caused by the skin effect in the gradient coil.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A gradient coil configured to generate gradient magnetic fields along a plurality of axes in an imaging space in which a subject is imaged, comprising:
   plural coil pattern layers configured to generate the gradient magnetic fields along respective of the plurality of axes, wherein
   at least one of the coil pattern layers includes an electrically-conductive member formed so as to be partitioned in a thickness direction by plural electrically-insulative sublayers, and
   the partitioned electrically-conductive member included in the at least one of the coil pattern layers is configured to generate gradient magnetic fields extending in mutually the same axial direction.

2. The gradient coil according to claim 1, wherein the electrically-conductive member includes first sublayers of electrically-conductive members and second sublayers serving as the electrically-insulative sublayers, the first sublayers and the second sublayers being alternately laminated in the thickness direction.

3. The gradient coil according to claim 1, wherein the electrically-conductive member is structured with plural electrically-conductive sublayers arranged so as to have gaps therebetween in the thickness direction, so that the electrically-insulative sublayers are formed by the gaps.

4. The gradient coil according to claim 3, wherein the gaps are formed as hollow spaces by joining together end parts of the electrically-conductive sublayers.

5. The gradient coil according to claim 4, wherein
the hollow spaces are each formed to have a tube-like shape extending through an inside of the coil, and
the electrically-conductive member is configured to arrange refrigerant to flow through the hollow spaces.

6. A gradient coil configured to generate gradient magnetic fields along a plurality of axes in an imaging space in which a subject is imaged, comprising:
a plurality of coil patterns provided respectively for the plurality of axes, each of the plurality of coil patterns includes an electrically-conductive member, wherein
at least one of the plurality of coil patterns has a hollow space formed inside the electrically-conductive member, and projecting and recessed areas are provided on a surface of the hollow space, and
the electrically-conductive member and the hollow space included in the at least one coil pattern layer generate gradient magnetic fields extending in mutually the same axial direction.

7. The gradient coil according to claim 6, wherein
the hollow space is each formed to have a tube-like shape extending through an inside of the coil, and
the at least one of the plurality of coil patterns is configured to arrange refrigerant to flow through the hollow space.

8. A gradient coil configured to generate gradient magnetic fields along a plurality of axes in an imaging space in which a subject is imaged, comprising:
plural coil pattern layers configured to generate the gradient magnetic fields along respective of the plurality of axes, wherein
at least one of the coil pattern layers includes a first electrically-conductive sublayer and a second electrically-conductive sublayer laminated over the first electrically-conductive sublayer with an electrically-insulative sublayer interposed therebetween, and
the first electrically-conductive sublayer and the second electrically-conductive sublayer of the at least one of the coil patterns are configured to generate gradient magnetic fields in a mutually same axial direction.

* * * * *